(12) United States Patent
Lin et al.

(10) Patent No.: US 10,431,430 B2
(45) Date of Patent: Oct. 1, 2019

(54) PLASMA TREATMENT OF AN ELASTOMERIC MATERIAL FOR ADHESION

(71) Applicant: NIKE, Inc., Beaverton, OR (US)

(72) Inventors: Jen-Chuan Lin, Tainan (TW);
Chun-Wei Huang, Lukang Town (TW);
Pu-Yuan Chang, Taichung (TW);
Su-Wen Kao, New Taipei (TW);
Guo-Chang Wang, Taichung (TW)

(73) Assignee: NIKE, Inc., Beaverton, OR (US)

( * ) Notice: Subject to any disclaimer, the term of this patent is extended or adjusted under 35 U.S.C. 154(b) by 0 days.

(21) Appl. No.: 15/942,024

(22) Filed: Mar. 30, 2018

(65) Prior Publication Data

US 2018/0226231 A1    Aug. 9, 2018

Related U.S. Application Data

(63) Continuation of application No. 14/842,564, filed on Sep. 1, 2015, now Pat. No. 9,941,099.

(Continued)

(51) Int. Cl.
*B29C 65/48* (2006.01)
*H01J 37/32* (2006.01)
(Continued)

(52) U.S. Cl.
CPC .......... *H01J 37/32366* (2013.01); *A43B 9/12* (2013.01); *A43B 13/12* (2013.01);
(Continued)

(58) Field of Classification Search
CPC ......... A43B 11/00; A43B 13/32; A43B 25/00; A43B 9/12; A43D 11/00; A43D 25/00;
(Continued)

(56) References Cited

U.S. PATENT DOCUMENTS

2002/0091222 A1   7/2002   Viegas et al.
2007/0105472 A1*  5/2007   Marche .................. B32B 27/12
                                                         442/394
(Continued)

FOREIGN PATENT DOCUMENTS

CN    101474627 A    7/2009
JP    2002234113 A1  8/2002
(Continued)

OTHER PUBLICATIONS

International Search Report and Written Opinion dated Nov. 18, 2015 for International Patent Application No. PCT/US2015/048128, 14 pages.
(Continued)

*Primary Examiner* — George R Koch
(74) *Attorney, Agent, or Firm* — Shook, Hardy & Bacon LLP

(57) ABSTRACT

Elastomeric components, such as a shoe outsole, are treated with a plasma application to clean and activate the elastomeric component. The application of plasma is controlled to achieve a sufficient surface composition change to enhance adhesion characteristics while not adversely physically deforming the elastomeric component. The plasma treatment is applied to increase carbonyl functional group concentrations within an altered region of the elastomeric component to within at least a range of 2%-15% of carbon atomic percentage composition. The cleaning and activation is controlled, in part, by ensuring a defined height offset range is maintained between the elastomeric component and the plasma source by a generated tool path. The elastomeric component may then be adhered, with an adhesive, to another component.

20 Claims, 5 Drawing Sheets

Related U.S. Application Data

(60) Provisional application No. 62/044,769, filed on Sep. 2, 2014.

(51) Int. Cl.
| | | |
|---|---|---|
| *B29C 65/00* | (2006.01) | |
| *B05D 3/14* | (2006.01) | |
| *A43D 11/00* | (2006.01) | |
| *A43D 25/00* | (2006.01) | |
| *B32B 38/00* | (2006.01) | |
| *C08J 7/12* | (2006.01) | |
| *C09J 5/02* | (2006.01) | |
| *B32B 37/12* | (2006.01) | |
| *A43B 9/12* | (2006.01) | |
| *A43B 13/32* | (2006.01) | |
| *A43B 13/12* | (2006.01) | |
| *H01J 37/317* | (2006.01) | |
| *B29L 31/50* | (2006.01) | |
| *B29K 623/00* | (2006.01) | |

(52) U.S. Cl.
CPC .............. *A43B 13/32* (2013.01); *A43D 11/00* (2013.01); *A43D 25/00* (2013.01); *B05D 3/144* (2013.01); *B29C 65/48* (2013.01); *B29C 66/026* (2013.01); *B29C 66/45* (2013.01); *B29C 66/95* (2013.01); *B32B 37/1284* (2013.01); *B32B 38/0008* (2013.01); *C08J 7/123* (2013.01); *C09J 5/02* (2013.01); *H01J 37/317* (2013.01); *H01J 37/32733* (2013.01); *B29K 2623/083* (2013.01); *B29L 2031/504* (2013.01); *B32B 2319/00* (2013.01); *B32B 2437/02* (2013.01); *H01J 2237/335* (2013.01); *H05H 2245/123* (2013.01)

(58) Field of Classification Search
CPC ..... B05D 3/144; B29C 66/028; B32B 38/008; C08J 7/123; H01J 37/32366; H05H 2245/123

See application file for complete search history.

(56) References Cited

U.S. PATENT DOCUMENTS

| | | | |
|---|---|---|---|
| 2010/0021676 | A1 | 1/2010 | Laubry |
| 2014/0144895 | A1 | 5/2014 | Stork Genannt Wersborg et al. |

FOREIGN PATENT DOCUMENTS

| | | |
|---|---|---|
| KR | 20090106722 A | 10/2009 |
| WO | 0001528 | 1/2000 |
| WO | 20120156071 A1 | 11/2012 |

OTHER PUBLICATIONS

International Preliminary Report on Patentablility dated Mar. 16, 2017 for International Patent Application No. PCT/US2015/048128, 9 pages.
Database WPI Week 200322, Thomson Scientific, London, GB; AN 2003-224021, XP002750657, 1 page.
Database WPI Week 200977, Thomson Scientific, London, GB; AN 2009-Q32081, XP002750658, 1 page.
Database WPI Week 200949, Thomson Scientific, London, GB; AN 2009-L62268, XP002750659, 1 page.

* cited by examiner

PLASMA TREATMENT OF AN ELASTOMERIC MATERIAL FOR ADHESION

CROSS-REFERENCE TO RELATED APPLICATIONS

This application is a continuation of U.S. application Ser. No. 14/842,564, filed Sep. 1, 2015, now U.S. Pat. No. 9,941,099 and entitled "PLASMA TREATMENT OF AN ELASTOMERIC MATERIAL FOR ADHESION," which claims priority to U.S. Provisional Application No. 62/044,769, filed Sep. 2, 2014, and entitled "PLASMA TREATMENT OF AN ELASTOMERIC MATERIAL FOR ADHESION." The entirety of both of the aforementioned applications is incorporated by reference herein.

TECHNICAL FIELD

Aspects provide methods and systems for cleaning and/or priming a surface for adhesion by an adhesive.

BACKGROUND

Prior to adhering an elastomeric component, such as a component made from saturated or unsaturated rubber(s), a surface cleaning is traditionally performed. The surface cleaning may include both mechanical cleaning to remove particles as well as chemical cleaning to remove oils and other agents that could affect an adhesive bond. This multi-step cleaning process has been used traditionally in the footwear industry to prepare and prime an outsole component for eventual bonding with an upper and/or midsole portion. However, this cleaning process can consume energy (e.g., drying energy), chemicals, (e.g., solvents), and time.

BRIEF SUMMARY

Aspects hereof provide systems and methods for cleaning an elastomeric component with plasma. The component is identified such that a plasma source may be positioned relative thereto. The positioning of the plasma source is within a height offset range of 20-40 millimeters of the component to achieve a desired surface treatment without thermally damaging the component. Plasma is applied in one or more applications to the component to sufficiently clean and activate the component surface, such as by applying plasma until the elastomeric component has a carbonyl functional group concentration of 2% to 15% within an altered region of the component. Following the achievement of the appropriate carbonyl functional group concentration, an adhesive is applied to the component.

This summary is provided to enlighten and not limit the scope of methods and systems provided hereafter in complete detail.

DESCRIPTION OF THE DRAWINGS

The present invention is described in detail herein with reference to the attached drawing figures, wherein.

DETAILED DESCRIPTION

Figure 1:
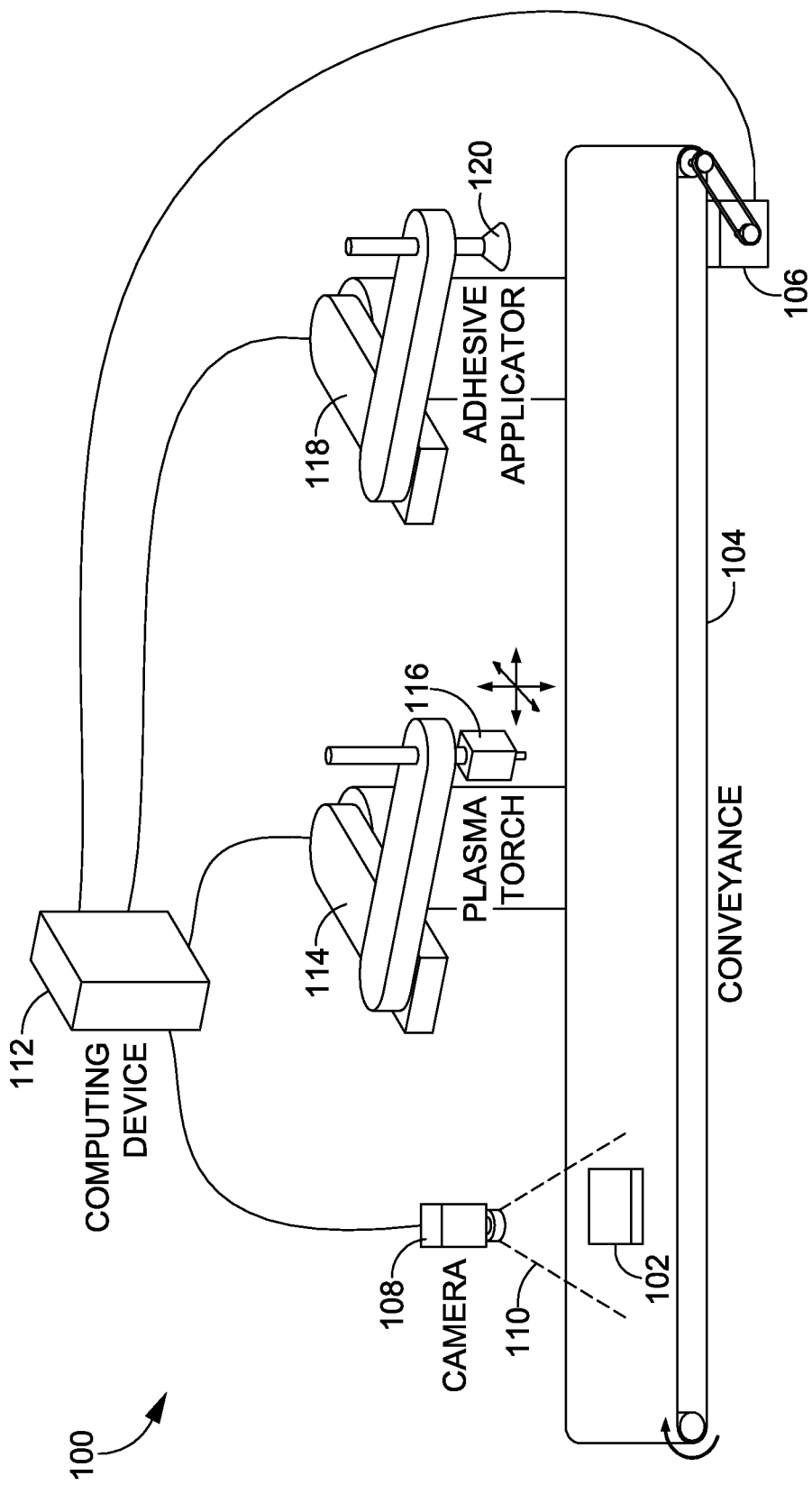
FIG. 1 depicts an exemplary plasma cleaning system, in accordance with an aspect hereof.

Aspects hereof provide systems and methods for cleaning an elastomeric component with plasma. The component is identified such that a plasma source may be positioned relative thereto. The positioning of the plasma source is within a height offset range of 20-40 millimeters of the component to achieve a desired surface treatment without thermally damaging the component. Plasma is applied in one or more applications to the component to sufficient clean and activate the component surface, such as by applying plasma until the elastomeric component has a carbonyl functional group concentration of 2% to 15% of carbon atomic percentage within an altered region of the component. Following the achievement of the appropriate carbonyl functional group concentration, an adhesive is applied to the component.

As will be discussed throughout, it is contemplated that aspect provided herein are directed to the manufacture of at least portions of an article of footwear. As such, an article of footwear, such as a shoe, will be discussed for contextual purposes, but it is not limiting as to the scope of applicability for aspects claimed herein. While the following examples of shoe uppers and shoe bottom units are presented in a simplified fashion for exemplary purposes herein, in practice a shoe upper may comprise a large number of individual parts, often formed from different types of materials. Alternatively, a shoe upper may be primarily formed from a single manufacturing technique, such as weaving or knitting, to concurrently and integrally form two or more portions of the shoe upper. The components of a shoe upper may be joined together using a variety of adhesives, stitches, and other types of joining/bonding components.

A shoe bottom unit may often comprise a shoe sole assembly with multiple components. For example, a shoe bottom unit may comprise an outsole made of a relatively hard and durable material, such as an elastomeric material like a saturated or an unsaturated rubber, which contacts the ground, floor, or other surface. A shoe bottom unit may further comprise a midsole formed from a material that provides cushioning and absorbs/attenuates force during normal wear and/or athletic training or performance. Examples of materials often used in midsoles are, for example, ethylene vinyl acetate ("EVA") foams, polyurethane foams, and the like. Shoe soles may further have additional components, such as additional cushioning components (such as springs, air bags, and the like), functional components (such as motion control elements to address pronation or supination), protective elements (such as resilient plates to prevent damage to the foot from hazards on the floor or ground), and the like. While these and other components that may be present in a shoe upper and/or a shoe bottom unit are not specifically described in examples herein, such components may be present in articles of footwear manufactured using systems and methods in accordance with aspects hereof.

As can be appreciated by the following, it is contemplated that plasma cleaning and features discussed in association may be used for the cleaning of any material or component. For example, it is contemplated that aspects provided herein may be utilized to prepare and clean a plastic surface (e.g., a polymer-based material) for the adhesion of one or more elements. To this example, it is contemplated that an outsole plate or other sole structure may be treated with plasma in preparation for application of a traction element, such as a cleat. In an exemplary aspect, plasma cleaning is applied to at least a surface of a rubber outsole to allow for an effective bond with a midsole portion. It is contemplated that the plasma cleaning is used in the alternative of a traditional chemical solvent to degrease the outsole surface for receipt of an adhesive. Further, the chemical alteration of the elastomeric component's surface by the plasma may reduce or eliminate the typical application of a primer that is traditionally used for increased bonding of an adhesive. Therefore, use of plasma may reduce the environmental effects of chemical applications for cleaning and/or priming.

Further, as will be evident hereinafter, the use of plasma as a cleaning mechanism has been contemplated in other applications for use on other materials previously. For example, the computing industry has implemented the use of plasma for cleaning the surface of silicon chips. Unlike the elastomeric components contemplated herein, the silicon chip is able to withstand a higher intensity of plasma that is delivered from a closer distance than contemplated herein. If the same plasma intensity and distance as used in the silicon chip industry was applied to an elastomeric component, such as a rubber outsole, the elastomeric component may be damaged, such as deformed or even burnt. Further, the chemical composition of the elastomeric components differs from the silicon chip industry target components such that a different resulting effect is realized from the application of plasma energy. For example, a rubber component that is exposed to plasma at given heights of exposure generates functional groups (e.g., carbonyl groups) that are effective for adhesion purposes. Additionally, as will be discussed hereinafter, the elastomeric material provided herein may benefit from a multiple-pass application approach for plasma to ensure that an appropriate surface temperature is not exceeded for the elastomeric component while still providing an opportunity for the plasma to chemically alter the elastomeric component surface for adhesion purposes. In the computing chip industry, a single plasma application at a slower speed, higher intensity, and/or closer offset distance may be implemented as a concern of thermal damage to the substrate of the silicon chip is less.

Referring now to FIG. 1, an exemplary plasma cleaning system 100 for use with an elastomeric component is depicted, in accordance with aspects hereof. The components are depicted generically for discussion purposes. It is understood that one or more of the components may be omitted, moved, or repositioned/reconfigured in aspects hereof. Further, it is contemplated that additional components (e.g., conveyance mechanisms, plasma sources, adhesive applicator, etc.) may be implemented. Further, while an illustrative configuration of the various components are depicted, it is understood they are exemplary in nature and are not limiting. For example, a conveyance mechanism 104 is illustrated as a belt-like mechanism; however, it is contemplated that a component may be moved/conveyed by any means, such as a multi-axis robot or a human. Similarly, a plasma torch 116 is depicted as being coupled with a multi-axis mechanism 114; however, it is contemplated that any movement mechanism may be implemented to achieve appropriate dimensional movement (e.g., axial movement and rotation).

The system 100 is comprised of a component 102, the conveyance mechanism 104, a conveyance drive 106, a vision system/camera 108, a field-of-view 110, a computing device 112, the multi-axis mechanism 114, the plasma torch 116, a multi-axis mechanism 118, and an adhesive applicator 120. It is understood that any combination of components, may be used in any number and in any fashion within aspects hereof.

Plasma is an ionized gas and is one of the four fundamental states of matter. Plasma is a gas (e.g., multiple element gas and single element gas) into which sufficient energy is provided to free electrons from atoms or molecules and to allow both species, ions and electrons, to coexist. Stated differently, plasma is an ionized gas consisting of positive ions and free electrons in proportions resulting in more or less no overall electric charge. Plasma may exist in both a thermal and a non-thermal form. The distinction between thermal and non-thermal may be determined by the temperature of electrons, ions and neutrals. Thermal plasmas have electrons and the heavy particles at substantially the same temperature, i.e., they are in thermal equilibrium with each other. Non-thermal plasmas have the ions and neutrals at a much lower temperature whereas electrons are at a significantly greater temperature. Aspects provided herein rely on a non-thermal plasma for plasma cleaning of an elastomeric component, in accordance with an exemplary aspect.

The component 102 is depicted in a generic manner for illustration purposes. However, as already discussed, it is contemplated that the component 102 may be a portion of an article of footwear, such as a shoe outsole. Any component formed from any material is contemplated, such as polymer-based materials. In exemplary aspects, an elastomeric component, which is a component formed from an elastomeric material, is treated by the methods and systems provided herein. Elastomeric materials include polymeric compounds having viscoelasticity. Examples of elastomeric materials include both saturated rubbers and unsaturated rubbers. An unsaturated rubber is an elastomeric material that can be cured with sulfur vulcanization, such as natural rubber, isoprene rubber, butadiene rubber, chloroprene rubber, polychloroprene, butyl rubber, styrene-butadiene rubber, and the like, for example. A saturated rubber is a rubber that cannot be cured with sulfur vulcanization. Examples of saturated rubber include ethylene propylene rubber, ethylene propylene diene rubber, silicone rubber, polyacrylic rubber, ethylene-vinyl acetate (EVA), and the like, for example.

The component 102 may have any shape, size, and orientation. In an exemplary aspect the component 102 is a shoe outsole having the ground-contacting surface (e.g., treads) oriented away from the plasma torch 116. In the non-limiting example illustrated, the tread side would be positioned on the conveyance mechanism 104; however, it is contemplated that any (or no) conveyance mechanism may be used in aspects hereof. This presented orientation of the component 102 allows for plasma to be applied to a top surface of the component 102, which can then be primed for receipt of an adhesive for eventual bonding with another component, such as a bottom surface of a midsole, for example and as will be depicted in FIG. 5 hereafter.

The conveyance mechanism 104 is depicted as a belt-like mechanism; however, it is contemplated that it may be any mechanism effective for positioning the component 102 in a location for operations provided herein (e.g., plasma application). It is further contemplated that the conveyance mechanism 104 is adapted for receipt of plasma energy that may not be contained to the component 102. For example, it is contemplated that the conveyance mechanism 104 is formed from a material that is tolerant to plasma energy to allow consistent and continued operation. The conveyance mechanism is motioned by conveyance drive 106. The conveyance drive 106 is effective for causing the conveyance mechanism 104 to position the component 102 at desired locations for operations provided herein. As will be discussed, it is contemplated that the conveyance drive 106 is controlled by a computing device, such as the computing device 112, for example.

In order to identify the size, shape, orientation, and specifics of the component 102, it is contemplated that a vision system or other part identification system (e.g., imaging, detection, sensing) is implemented. For example, the camera 108 having a field-of-view 110 is depicted as providing sensing information to a computing device, such as the computing device 112. The vision system having the camera 108 is effective for locating and identifying a component, such as the component 102. The vision system may utilize a three-dimensional image capture technology (e.g., multiple perspective cameras, laser scanning) to generate a three-dimensional mapping of the component for the computing device 112 to generate tool path that can be used by one or more components (e.g., the plasma torch 116, the multi-axis mechanism 114, 118, the adhesive applicator 120), as will be discussed in greater detail hereinafter. Therefore, it is contemplated that the camera 108 is operably (e.g., electrically) coupled with the computing device 112 to effective communicate information there between.

The computing device 112 is but one example of a suitable computing environment and is not intended to suggest any limitation as to the scope of use or functionality of the invention. Neither should the computing device 112 be interpreted as having any dependency or requirement relating to any one or combination of components illustrated. The computing device 112 includes a bus that directly or indirectly couples the following devices: memory, one or more processors, and one or more components (e.g., multi-axis mechanisms, plasma torch, and adhesive applicator).

Computing device 112 typically includes a variety of computer-readable media. Computer-readable media can be any available media that can be accessed by computing device 112 and includes both volatile and nonvolatile media, removable and non-removable media. By way of example, and not limitation, computer-readable media may comprise computer-storage media and communication media. Computer-storage media includes volatile and nonvolatile, removable and non-removable media implemented in any method or technology for storage of information such as computer-readable instructions, data structures, program modules or other data.

Computer-storage media includes RAM, ROM, EEPROM, flash memory or other memory technology, CD-ROM, digital versatile disks (DVD) or other optical disk storage, magnetic cassettes, magnetic tape, magnetic disk storage or other magnetic storage devices. Computer storage media does not comprise a propagated data signal.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory includes computer-storage media in the form of volatile and/or nonvolatile memory. The memory may be removable, nonremovable, or a combination thereof. Exemplary memory includes non-transitory, solid-state memory, hard drives, optical-disc drives, etc. Computing device 112 includes one or more processors that read data from various entities.

The computing device 112 is therefore effective for coordinating one or more components provided herein for purposes of accomplishing methods supported herein. For example, it is contemplated that the computing device 112 processes instructions allowing for an image captured by the camera 108 to identify and position the component 102 in order to generate a three-dimensional mapping of the component 102. This three-dimensional mapping of the component 102 may then be used by the computing device 112 to generate one or more tool paths for one or more components. For example, a tool path for the application of plasma may be generated by the computing device 112, which will be implemented by the multi-axis mechanism 1145 and the plasma torch 116. Similarly, it is contemplated that a tool path may be generated by the computing device 112 for use by the multi-axis mechanism 118 and/or the adhesive applicator 120 for the application of adhesive to the component 102. A tool path is a component-specific coordination of movement in space for a given mechanism/tool that accounts for specific (e.g., size, shape, location, orientation) of a component. As provided herein, it is contemplated that any number of components may be used in combination to achieve the results intended. For example, it is contemplated that one, two, three . . . or 'N' number (where 'N' is any number) of multi-axis movement mechanisms, plasma torches, and/or adhesive applicators can be used in any combination. Further, while examples herein provide for a combination of components, such as a movement mechanism, plasma torch, and adhesive applicator, it is understood that one or more of those components may be omitted altogether, combined into a common physical device, and/or modified. Examples include a plasma torch only, an adhesive applicator only, a plasma torch and movement mechanism only, an adhesive applicator and movement mechanism only, a plasma torch and adhesive applicator only, for example.

While a single computing device 112 is depicted, it is contemplated that any number of computing device in any configuration may be implemented to achieve aspects provided herein.

The multi-axis mechanism 114, 118 is generally depicted as a multi-axial movement mechanism that has multiple degrees of movement freedom (e.g., X, Y, Z, rotation about each axis). However, as previously discussed, the various components of FIG. 1 are depicted for exemplary purposes and are not intended to be limiting. For example, it is contemplated that one or more of the movement mechanisms may be X-Y tables or other movement mechanisms effective for achieving a degree of motion for generating results provided herein (e.g., application of plasma, application of adhesive).

The multi-axis mechanism 114, 118 is coupled with a computing device, such as the computing device 112. The computing device may be effective for the control of movement of the multi-axis mechanism 114, 118, such as through computer-numeric-control (CNC) movement control, for example. Further, it is contemplated that the computing device is effective for coordinating the movement and application of various components (e.g., the multi-axis mechanism 114 and the plasma torch 116). Further, while the computing device 112 is depicted as being physically independent of the multi-axis mechanism 114, it is contemplated that any configuration (e.g., integrated) may be utilized.

The plasma torch 116 is effective for applying plasma to a component 102. In an exemplary aspect, the plasma torch is a plasma generator that utilized a multi-gas composition (e.g., atmospheric air) to form the plasma. For example, it is contemplated that the application of plasma to the component occurs at atmospheric pressure, which allows for a continuous processing (rather than batch processing). Plasma generated at atmospheric conditions is referred to as atmospheric pressure plasma. The plasma torch generates plasma by a high voltage between an anode and cathode, which is blown out through a nozzle on the plasma torch 116 with a working gas, such as atmospheric air. The frequency of energy and a pulsing pattern (e.g., single pulse of energy, double pulse of energy) of the energy may be varied to form the plasma, in some aspects. It is contemplated that a rotary nozzle may be implemented to apply plasma in a pulse-like manner to limit the heat input to the component 102, which could deform or otherwise negatively affect an elastomeric material. To further limit the effect of thermal input, it is contemplated that a multi-pass tool path may be implemented that uses multiple plasma sources or a repeated passing of a common plasma source, in an exemplary aspect. The nozzle and/or the number of plasma application passes may be adjusted to achieve a desired surface treatment (e.g., cleaning, activation) while maintaining a temperature below a predefined value, in an exemplary aspect.

The application of plasma to an elastomeric component results in a physical cleaning as well as an activation of the elastomeric material. As such, variables associated with the application of plasma affect the cleaning and activation of the material. Therefore, testing has determined that suitable results are achieved with specific variable ranges. For example, when a plasma torch is placed outside of a 20-40 millimeter (mm) offset height from the surface of the component 102 a desired surface treatment may not be achieved. In particular, a rubber component to which adhesive is to be applied for an article of footwear may not achieve a desired level of carbonyl functional group development on a treated surface when the plasma torch is positioned outside of a 20-40 mm offset height range. A 25-35 mm offset height is used in an aspect. A 35-40 mm offset height is used in an aspect. Application of plasma outside of the provided ranges may result in an insufficient surface treatment to a particular material. However, it is contemplated that different materials may achieve a desired surface treatment outside of provided ranges. Further, it is contemplated that travel speeds and plasma intensities may be adjusted to achieve provided ranges. Further, while a usable surface treatment (e.g., activation and/or cleaning) may be achieved at a closer distance than provided by the ranges, an input heat value of the plasma may exceed a predefined value that could result in surface deformation, burning, or other undesired results, in an exemplary aspect.

In an exemplary aspect, the application of plasma is provided to form functional carbonyl (i.e. C=O) groups on the surface of the component 102. Carbonyl groups may result from a formation of a radical state on the surface of the component 102 caused by the application of plasma to the surface. The radical state of the surface reacts with oxygen, such as oxygen found in the ambient air or from the working gas of the plasma, to form the functional carbonyl groups. The formation of the carbonyl groups may be affected by the working gas (e.g., atmospheric air that is a mixed gas, oxygen (e.g., O2) gas, hydrogen (e.g., H2) gas), the travel speed, the offset height, the material of the component, the duration of application, the pattern of application, and the like. In an aspect, a 2% to 15% carbonyl functional group formation on the component surface (i.e. altered region) composition is achieved. Within this range, a sufficient adhesion bond can be achieved for use in an article of footwear, for example. In an aspect, a 2%-9% formation of carbonyl as a surface composition is achieved. Stated differently, a surface composition in an altered region of the component increases in carbonyl functional groups by at least 2% as a result of one or more plasma applications to the surface of the component. As will be discussed with FIG. 4, a surface composition is in reference to an altered region that extends at least a certain distance (e.g., penetration depth) into the component. For example, aspects achieve a penetration depth of the 10-800 nanometers in which a carbonyl functional group is sufficiently detected. Therefore, at least a 2% increase in carbonyl functional groups is achieved in an altered region of the component surface extending inwardly 10-800 nanometers, in an exemplary aspect.

In addition to an increase in carbonyl functional groups within the altered region, aspects contemplate applying plasma to achieve a reduction in the carbon to carbon (C—C) and the carbon to hydrogen (C—H) bonds within the altered region. In an aspect, a 27%-17% reduction in C—C and C—H bonds is achieved, which further aids in the adhesion characteristics of a to-be-applied adhesive. Variations in C—C and C—H bonds are affected by plasma application variable discussed above (e.g., offset height, power, speed, and number of passes, material, and the like). The listing of percentages of carbon based groups (e.g., C=O, C—C, C—H) is a carbon atomic percentage as used herein.

The following table provides data on the composition percentage for carbon found in an altered region of a rubber plasma cleaned component. The percentage of carbonyl functional group in the control samples registered at 0.3% and 0.4%. However, following a plasma treatment at 30 mm, a first test resulted in a 9.1% and a second test resulted in an 8.3% atomic composition percentage. Therefore, the application of plasma at 30 mm increased the carbonyl composition 8.8% (9.1–0.3) to 7.9% (8.3–0.4), in this exemplary data. This increase in carbonyl functional groups in the 7.9% to the 8.8% range allows for the plasma cleaned component to achieve a desired adhesion characteristic. Similarly, the C—C bonds and the C—H bonds decreased as a result of the plasma cleaning at 30 mm from a 94.2% and 94.5% down to a 67.3% and 70.1%, which provides a C—C and C—H bond composition decrease in the range of 27.2% and 24.1%. In aspects, it is contemplated that achieving a carbonyl concentration percentage in the 2% to 15% range allows for an elastomeric component to have sufficient adhesion characteristics for an article of footwear.

|  | C=O | C—O & C—N | C—C & C—H |
|---|---|---|---|
| 30 mm test 1 | 9.1% | 23.6% | 67.3% |
| 30 mm test 2 | 8.3% | 21.6% | 70.1% |
| 37.5 mm test 1 | 3.7% | 22.9% | 73.4% |
| 37.5 mm test 2 | 3% | 19.7% | 77.4% |

-continued

|  | C═O | C—O & C—N | C—C & C—H |
|---|---|---|---|
| 45 mm test 1 | 1.9% | 10.9% | 87.2% |
| 45 mm test 2 | 1.8% | 10.5% | 87.7% |
| Control 1 | 0.3% | 5.6% | 94.2% |
| Control 2 | 0.4% | 5.2% | 94.5% |

The foregoing is exemplary in nature and is constrained to an exemplary plasma torch configuration on an exemplary elastomeric rubber component and is not limiting in scope, but exemplary in nature.

While a single plasma torch 116 is depicted in FIG. 1, it is contemplated that multiple plasma torches may be implemented to achieved aspects hereof. Further, it is contemplated that a common plasma torch may operate on a multi-pass tool path that re-applies plasma to one or more portions of the component. The use of multiple plasma torches or the re-application of plasma by a common plasma source may allow for a predefined delay time to be experienced by a component, which may be effective for the surface of the component to remain below a predefined temperature. Remaining below a temperature may limit surface deformation that is unintended or undesirable.

Returning to FIG. 1, the adhesive applicator 120 is an applicator of adhesive. As the adhesive applicator 120 is coupled with the multi-axis mechanism 118, a computing device can control the application of adhesive over a three-dimensional space. It is contemplated that the adhesive applicator 120 is a spray applicator, a brush applicator, a roller applicator, and/or the like. In an exemplary aspect, adhesive is applied to the component after the application of plasma, which cleans and activates (e.g., increases carbonyl functional groups) the surface for receipt of the adhesive.

While a specific arrangement of devices and components are depicted in FIG. 1, it is understood that aspects contemplated herein are not limited to the illustrations and discussion of FIG. 1. For example, it is contemplated that different conveyance mechanisms, different multi-axis mechanisms, and the like may be implemented. Further, it is contemplated that a different number and configuration of mechanisms and component s may be implemented. For example, two or more plasma torches may be utilized in exemplary aspects.

Figure 2:
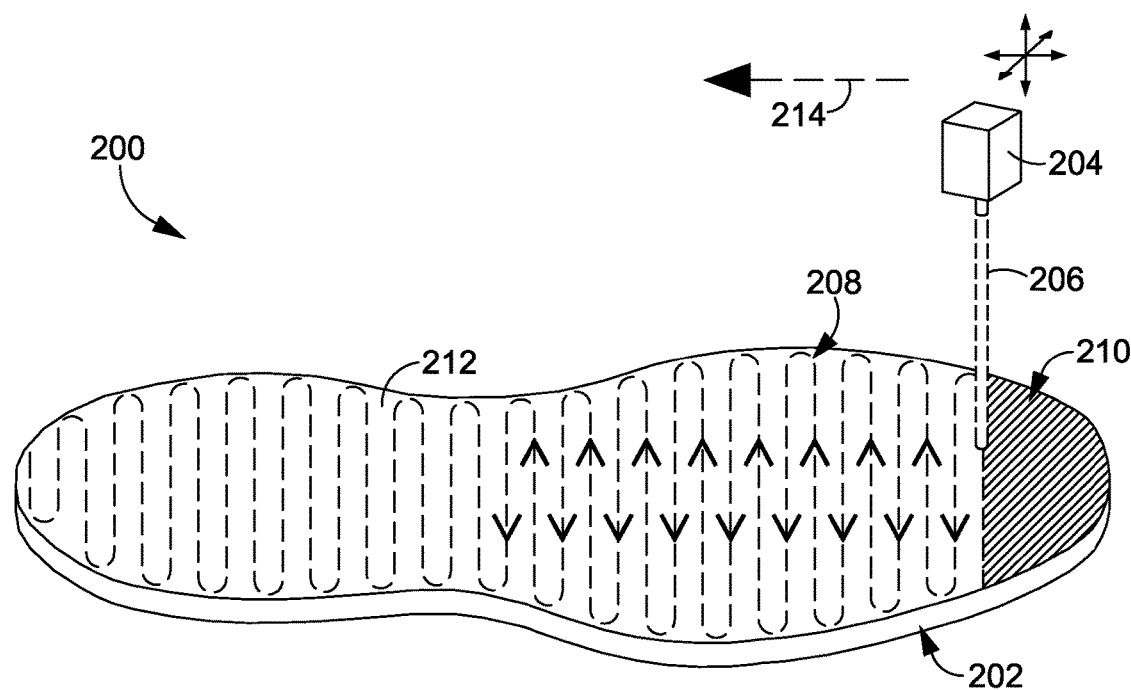
FIG. 2 depicts an exemplary component on to which plasma is being applied along a tool path, in accordance with an aspect hereof.

FIG. 2 depicts plasma cleaning 200 of an exemplary elastomeric component 202, in accordance with aspects hereof. In this example, a superior surface 212 (e.g., non-treaded surface) of a shoe outsole representing the component 202 is depicted. A plasma torch 204 is generally depicted as having multiple degrees of freedom for traversing the component 202. Plasma 206 is depicted as emanating from the plasma torch 204 on to the surface 212. An exemplary tool path 208, which may be preprogrammed or dynamically determined by a computing device, is illustrated for discussion purposes.

The tool path 208 may traverse the component 202 in any manner. In the currently illustrated example, a medial to lateral motion path is depicted for purposes of achieving a throughput time while achieving a surface preparation by the plasma 206. In alternative aspects a heel to toe or a perimeter-based tool path may alternatively (or additionally) be implemented. The tool path 208 may be generated to allow application of plasma to areas of the surface 212 intended for application of adhesive, if not the entirety, in an exemplary aspect. Further, while a seemingly two-dimensional tool path 208 is illustrated, it is understood that the component 202 may be multi-dimensional and therefore the tool path 208 is actually in a three-dimensional space to ensure appropriate offset heights are achieved during the application of plasma 206. In this example, the general direction of the plasma torch is in the direction of arrow 214 (a toe to heel direction); however, it is understood that the arrow 214 may be oriented in any appropriate direction. Further, the tool path 208 may also include information dictating the plasma intensity, angle of application, speed of movement, and the like.

Area 210 represents a plasma cleaned (e.g., cleaned and activated with carbonyl functional groups) area of the component 202. The area 210 has a carbonyl functional group percentage of composition that is at least 2% greater than the non-plasma treated (e.g., heel end) areas of the surface 212.

Figure 3:
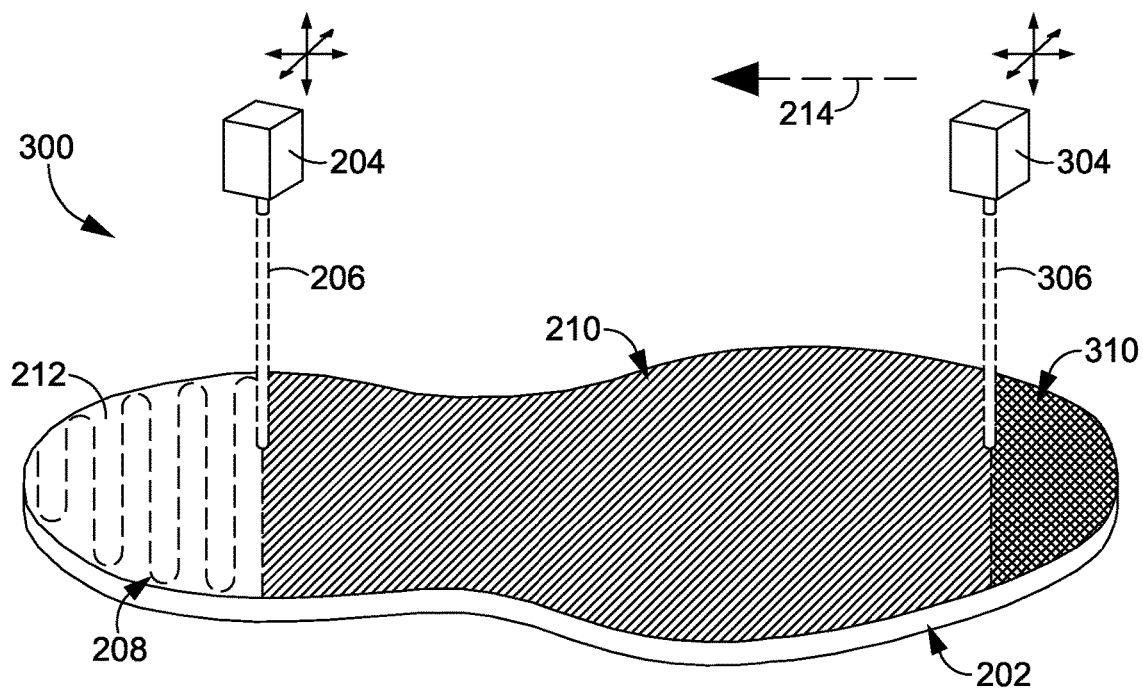
FIG. 3 depicts an exemplary component on to which a second application of plasma is being applied along a tool path, in accordance with an aspect hereof.

FIG. 3 depicts and alternative plasma cleaning 300 of FIG. 2 plasma cleaning 200, in accordance with aspects hereof. In this example, the plasma torch 204 applies plasma 206 along the tool path 208 on the surface 212 of component 202 forming a first plasma application area 210. Further, a second plasma torch 304 follows a tool path, such as the tool path 208, over the surface 212 forming a second pass area 310. The second pass area 310 is a second application of plasma, such as plasma 306, to further clean and activate the surface 212. A second plasma application may allow the thermal input of the plasma to be limited in a manner that reduces thermally-induced deformation or damage to the surface 212. For example, the second plasma torch 304 may delay a predetermined time (which may be factored into the tool path) prior to applying plasma 306. This introduced delay may allow the surface 212 to thermally stabilize or reduce prior to introducing thermal energy from the plasma in the second pass.

While a specific arrangement and configuration of tool path, components, and timing is illustrated in FIG. 3, it is exemplary in nature and not intended to be limiting in nature. For example, a second plasma application pass may be provided by the plasma torch 204 that provided the initial plasma application. Further, it is contemplated that the entire first plasma application may be applied prior to applying the second plasma application, in an exemplary aspect. Additional variations are contemplated. Further, it is contemplated that additional application of plasma (e.g., three or more) may be provided in aspects. Plasma application may also occur in specific regions and at varied speeds, heights, angles, and intensities in some aspects. Further, it is contemplated that any sequence of operations may be implemented. For example, a first plasma pass, a first adhesive pass, a second plasma pass, and a second adhesive pass may be performed on one or more regions of the object. Any order of the operations may be performed.

Figure 4:
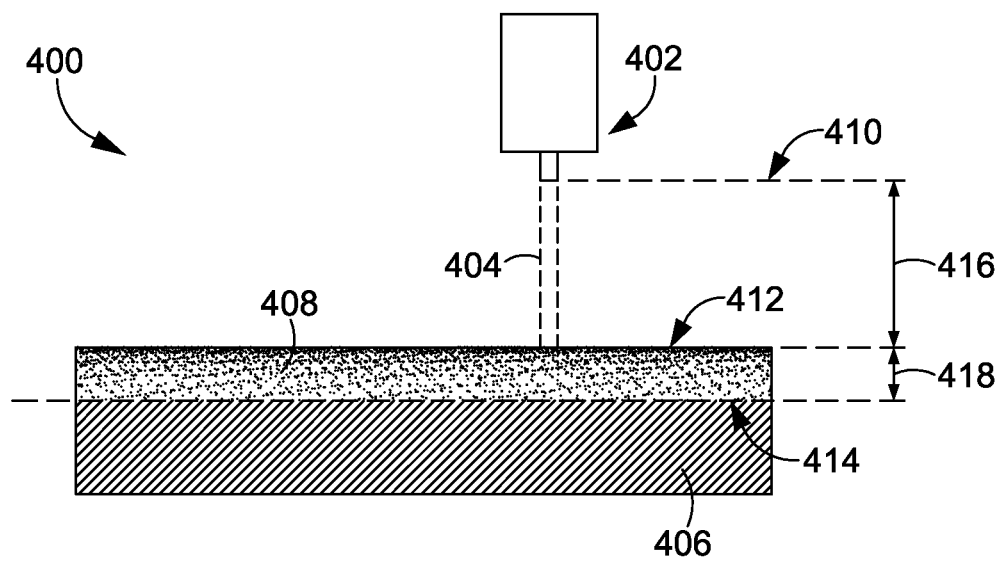
FIG. 4 depicts a cross-section perspective of a component having an altered region from the application of plasma, in accordance with an aspect hereof.

FIG. 4 depicts a cross-sectional perspective 400 of a component 406 having an altered region 408 from the application of plasma 404 from a plasma source 402, in accordance with aspects hereof. The altered region 408 extends from a surface 412 inwardly to a depth 414, which may be 10-800 nanometers. The altered region 408 is a region extending from the surface 412 where the plasma has altered the composition of material to increase carbonyl functional groups and/or reduce C—C and C—H bonds. Below the depth 414 the detectability of this composition alteration is insubstantial, in an exemplary aspect. The altered region is depicted as having a depth of 418, which may range from 10-800 nanometers in exemplary aspects utilizing parameters provided herein. For example, an offset height of 416 between the plasma source 402 nozzle and the surface 412 results in the depth 418 for the altered region 408, in an exemplary aspect. FIG. 4 is not drawn to scale, but instead illustrated for discussion purposes.

Figure 5:
FIG. 5 depicts a cross-sectional perspective of a first component, an adhesive, and a second component as mated, in accordance with an aspect hereof.

FIG. 5 depicts a cross-sectional perspective 500 for a component 506 bonded with a component 502 by an adhesive 504, in accordance with aspects hereof. In this example, the component 506 was plasma cleaned in accordance with aspects provided herein on a surface 508. The plasma cleaning and parameters selected for the plasma cleaning resulted in a surface treatment to surface 508 that is effective for adhesion by adhesive 504, such as an increase in carbonyl functional groups. It is understood that if carbonyl functional group increases in provided ranges, C—C bond and C—H bond decreases outside of provided ranges, and other parameters provided herein may result in an ineffectively prepared surface for adhesion purposes, in exemplary aspects. The elements of FIG. 5 are not drawn to scale and illustrated for exemplary purposes only. It is contemplated that a surface proximate the adhesive 504 of the component 502 may also be plasma cleaned to achieve a desired adhesion. For example, if the component 502 is an EVA-based material (e.g., EVA midsole), plasma cleaning may enhance the adhesion of the adhesive 504 for bonding with the component 506 (e.g., a rubber outsole), in an exemplary aspect.

Figure 6:
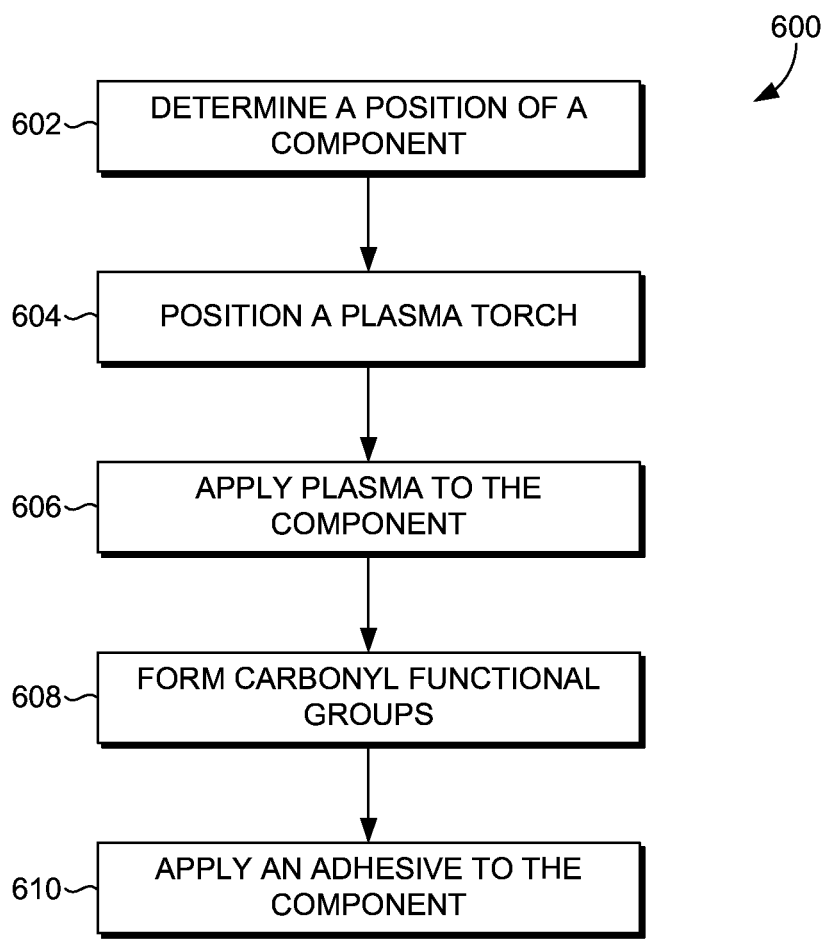
FIG. 6 depicts an exemplary method for plasma cleaning a component, in accordance with an aspect hereof.

FIG. 6 depicts a flow diagram 600 representing a method of cleaning an elastomeric component with plasma, in accordance with aspects hereof. At a block 602, a position of a component is determined. For example, it is contemplated that a visions system may be implemented to capture an image of the component. The position determination may be used for determining an appropriate tool path for a plasma source to traverse while applying plasma to the component. Further, the determination of the position may be used for identifying the part to apply an appropriate plasma cleaning operation. Further, determining of the position may be usable to appropriately position one or more components for plasma application, such as positioning a plasma torch at an appropriate relative location to the component. An appropriate location may include a height offset range to achieve an appropriate surface treatment on the component by the plasma. The determination of the position may be done in connection of a computing device and/or one or more sensors (e.g., proximity sensor).

At a block 604, a plasma torch is positioned. The positioning of the plasma torch may be aided by a computing device controlling a multi-axis mechanism (e.g., multiple degree of freedom robot). The positioning of the plasma torch may position the plasma torch at a predetermined offset height from the surface of the component, such as within a 20-40 mm, a 25-35 mm, and/or a 35-40 mm offset height range.

At a block 606, plasma is applied to the component. The plasma torch may direct plasma to the component along a specified three-dimensional space (e.g., a tool path) at a specified intensity and/or at a specified application rate (e.g., speed), in an exemplary aspect. The application of plasma to an elastomeric component generates carbonyl groups in an altered region extending into the component from the surface, as depicted at a block 608. The generation of the carbonyl groups is determined, in an aspect, based on parameters associated with the application of the plasma and parameters of the component material. For example, the working gas of the plasma, the nozzle of the plasma source, the offset height of the plasma source, the speed of plasma application, the tool path, and the like all affect the formation of the carbonyl groups, which can vary dramatically based on the parameters. Further, the material, such as a rubber material, responds differently than other materials (e.g., metals, silicon, and the like) to the parameters of plasma application, which cause a different functional group formation and composition. Additionally, because the surface treatment with plasma is performed, in an aspect for adhesion improvement by an adhesive, the carbonyl group increase in the provided ranges has been found to provide effective adhesion results, in exemplary aspects.

At a block 610, an adhesive is applied to the component. The adhesive may be any material effective to bond the component with a desired mating component, such as a shoe midsole. In an exemplary aspect, the adhesive is glue that is effective for bonding a rubber outsole that has been plasma treated with an EVA midsole, for example. The adhesive may be applied by an adhesive applicator and a multi-axis mechanism, which may be controlled, in part, by a computing device.

While specific steps are depicted in an exemplary order with FIG. 6, it is understood that additional or alternative steps may be implemented. Further, one or more of the recited steps may be omitted in exemplary aspects. Further, it is contemplated that any combination of components/tools and steps may be implemented.

Figure 7:
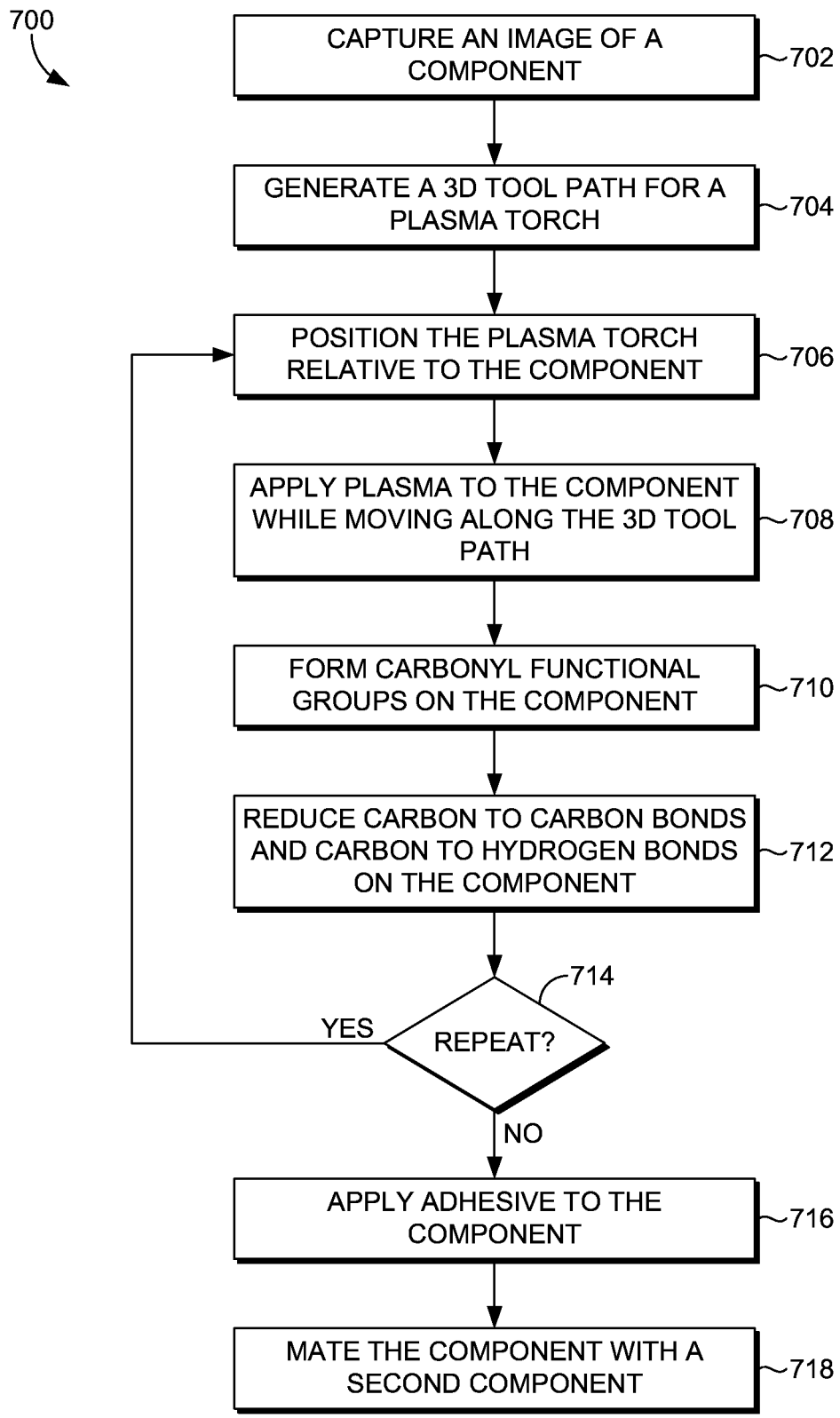
FIG. 7 depicts an additional exemplary method for plasma cleaning a component, in accordance with an aspect hereof.

FIG. 7 depicts a flow diagram 700 representing a method of cleaning an elastomeric component with plasma, in accordance with aspects hereof. At a block 702, an image of the component is captured. The image may be used to identify a particular component and to generate an appropriate tool path for a plasma source to traverse when applying plasma. The image may be provided to a computing device that is responsible for executing instructions for processing the image to identify the component and/or develop an appropriate tool path. As depicted in block 704, a tool path is generated. The tool path may be generated by the computing device taking into consideration constraints provided (e.g., general tool path) in combination with component specific information derived from the captured image (e.g., orientation, location, tolerance variations, and the like). As previously discussed, the tool path may include height offsets that are effective for maintaining a desired distance between the plasma source and the surface of the component.

Based on the tool path, a computing device in connection with a multi-axis mechanism may be implemented to position the plasma torch relative to the component, such as at an initial point in space for the tool path, as indicated at a block 706. The position may include X, Y, and Z coordinates along with rotational angles along any of the axis for appropriate application of plasma. At a block 708, plasma is applied to the component while the plasma source is moved along the tool path. Movement of the plasma source instead of only moving the component may allow for a more appropriately applied plasma with a faster throughput, in an exemplary aspect. At a block 710, carbonyl functional groups are formed in an altered region of the component to enhance adhesion characteristics of the component and to eliminate, in an exemplary aspect, chemical cleaning and priming. Further, at a block 712, C—C bonds and C—H bonds in the altered region are reduced, to further enhance the adhesion characteristics of the component. To limit thermal input and reduce thermal stress on the component, multiple plasma applications may be implemented to achieve a desired level of surface preparation on the component. If additional applications of plasma are to be provided, a decision block 714 returns to the block 706. Upon returning to block 706, it is contemplated that a different plasma source may be implemented or the same plasma source may be used again, in exemplary aspects.

If additional applications of plasma are not to be applied at decision block 714, the method advances to a block 716 at which an adhesive is applied to the component. The adhesive may be applied to the entirety of the plasma cleaned surface or it may be selectively applied. Further, it is contemplated that the adhesive may be applied at the control of a computing device and/or a multi-axis mechanism, in an exemplary aspect. At a block 718, the component is mated with a second component. The mating of the components is the combining of the components with the adhesive adhering the two components. The mating may be done manually or in an automated manner. In an example, the mating is the alignment and joining of a midsole portion with an outsole portion to form a shoe bottom unit.

While specific steps are depicted in an exemplary order with FIG. 7, it is understood that additional or alternative steps may be implemented. Further, one or more of the recited steps may be omitted in exemplary aspects.

From the foregoing, it will be seen that this invention is one well adapted to attain all the ends and objects hereinabove set forth together with other advantages which are obvious and which are inherent to the structure.

It will be understood that certain features and subcombinations are of utility and may be employed without reference to other features and subcombinations. This is contemplated by and is within the scope of the claims.

While specific elements and steps are discussed in connection to one another, it is understood that any element and/or steps provided herein is contemplated as being combinable with any other elements and/or steps regardless of explicit provision of the same while still being within the scope provided herein. Since many possible embodiments may be made of the disclosure without departing from the scope thereof, it is to be understood that all matter herein set forth or shown in the accompanying drawings is to be interpreted as illustrative and not in a limiting sense.

The invention claimed is:

1. A plasma treatment system, the plasma treatment system comprising:
   a first plasma torch;
   a first multi-axis conveyance mechanism coupled with the first plasma torch, the first multi-axis conveyance mechanism able to position the first plasma torch within a 20-40 millimeter offset height range from a surface of an elastomeric component;
   a component identification mechanism; and
   computer readable media having instructions embodied thereon that when executed by a processor:
   generate a tool path for the first multi-axis conveyance mechanism based on an input from the component identification mechanism; and
   control the first plasma torch and the first multi-axis conveyance mechanism to apply plasma to the surface while maintaining the 20-40 millimeter offset height range to form an altered region extending from the surface into the elastomeric component.

2. The plasma treatment system of claim 1, wherein the component identification mechanism comprises a vision system adapted to capture one or more images of the elastomeric component.

3. The plasma treatment system of claim 1, further comprising a second plasma torch coupled with a second multi-axis conveyance mechanism, the computer readable media further having instructions to control the second plasma torch and the second multi-axis conveyance system in connection with the first plasma torch and the first multi-axis conveyance mechanism.

4. The plasma treatment system of claim 1, further comprising an adhesive applicator, and the computer readable media further having instructions to control the adhesive applicator to apply adhesive to the surface of the elastomeric component.

5. The plasma treatment system of claim 4, wherein the adhesive applicator is coupled to a movement mechanism adapted to move the adhesive applicator prior to or during application of the adhesive to the surface of the elastomeric component.

6. The plasma treatment system of claim 1, wherein the elastomeric component is an elastomeric footwear component.

7. The plasma treatment system of claim 1, further comprising a conveyance mechanism adapted to shift the elastomeric component from a first position that is adjacent the first plasma torch to a second position that is distal from the first plasma torch, and the computer readable media further having instructions to control the conveyance mechanism.

8. The plasma treatment system of claim 1, wherein the first plasma torch comprises a plasma generator adapted to utilize a multi-gas composition at atmospheric pressure to form the plasma.

9. The plasma treatment system of claim 8, wherein the tool path is a multi-pass tool path.

10. The plasma treatment system of claim 1, wherein the tool path comprises a perimeter-based tool path.

11. The plasma treatment system of claim 1, wherein the tool path comprises a motion path that includes movement from a first side of the elastomeric component to a second opposing side of the elastomeric component.

12. The plasma treatment system of claim 1, wherein the first multi-axis conveyance mechanism is adapted to position the first plasma torch within a 35-40 millimeter offset height range from the surface of the elastomeric component.

13. The plasma treatment system of claim 1, wherein the first plasma torch is adapted to form the altered region extending into the elastomeric component from the surface to a depth greater than 10 nanometers.

14. The plasma treatment system of claim 13, wherein the first plasma torch is further adapted to form carbonyl functional groups in the altered region extending into the elastomeric component from the surface to a depth greater than 10 nanometers, the carbonyl functional groups resulting in a carbon atomic percentage of 2% to 15%.

15. The plasma treatment system of claim 13, wherein the first plasma torch is further adapted to reduce a carbon atomic percentage of carbon-to-carbon and carbon-to-hydrogen bonds in the altered region by a range of 28% to 17%.

16. A plasma treatment system, the plasma treatment system comprising:
   a first plasma torch, the first plasma torch comprising a plasma generator adapted to utilize a multi-gas composition at atmospheric pressure to form plasma;
   a first multi-axis conveyance mechanism coupled with the first plasma torch, the first multi-axis conveyance mechanism able to position the first plasma torch within a 20-40 millimeter offset height range from a surface of a component;
   a component identification mechanism; and
   computer readable media having instructions embodied thereon that when executed by a processor:

generate a multi-pass tool path based on input from the component identification mechanism; and control the first plasma torch and the first multi-axis conveyance mechanism to apply the plasma to the surface while maintaining the 20-40 millimeter offset height range to form an altered region extending from the surface into the component.

17. The plasma treatment system of claim 16, wherein the component identification mechanism comprises a vision system adapted to capture one or more images of the component.

18. The plasma treatment system of claim 16, further comprising a second plasma torch coupled with a second multi-axis conveyance mechanism.

19. The plasma treatment system of claim 16, wherein the first plasma torch is adapted to form the altered region extending into the component from the surface to a depth greater than 10 nanometers.

20. The plasma treatment system of claim 19, wherein the first plasma torch is further adapted to form carbonyl functional groups in the altered region extending into the component from the surface to a depth greater than 10 nanometers, the carbonyl functional groups resulting in a carbon atomic percentage of 2% to 15%.

* * * * *